(12) United States Patent
Zelder

(10) Patent No.: US 8,452,565 B2
(45) Date of Patent: May 28, 2013

(54) HF MEASUREMENT SYSTEM, METHOD FOR THE CALIBRATION THEREOF, AND METHOD FOR DETERMINING SCATTERING PARAMETERS WITH THIS HF MEASUREMENT SYSTEM

(75) Inventor: Thomas Zelder, Lueneburg (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 536 days.

(21) Appl. No.: 12/307,075

(22) PCT Filed: Jun. 19, 2007

(86) PCT No.: PCT/EP2007/005393
§ 371 (c)(1),
(2), (4) Date: Dec. 30, 2008

(87) PCT Pub. No.: WO2008/003399
PCT Pub. Date: Jan. 10, 2008

(65) Prior Publication Data
US 2009/0319217 A1 Dec. 24, 2009

(30) Foreign Application Priority Data
Jul. 3, 2006 (DE) .................. 10 2006 030 630

(51) Int. Cl.
*G01R 35/00* (2006.01)
*G06F 15/00* (2006.01)

(52) U.S. Cl.
USPC ........................................ 702/106

(58) Field of Classification Search
USPC .................... 702/85, 106, 189, 190
See application file for complete search history.

(56) References Cited

U.S. PATENT DOCUMENTS

| | | | |
|---|---|---|---|
| 5,608,330 A | 3/1997 | Heuermann | |
| 6,300,775 B1* | 10/2001 | Peach et al. | 324/601 |
| 6,529,844 B1* | 3/2003 | Kapetanic et al. | 702/85 |
| 7,235,982 B1* | 6/2007 | Shoulders | 324/638 |
| 2003/0115008 A1* | 6/2003 | Doi | 702/117 |
| 2004/0251922 A1* | 12/2004 | Martens et al. | 324/760 |
| 2007/0001686 A1* | 1/2007 | Parker et al. | 324/529 |

FOREIGN PATENT DOCUMENTS

DE 10308280 A1 11/2003

* cited by examiner

*Primary Examiner* — Bryan Bui
(74) *Attorney, Agent, or Firm* — DeLio & Peterson, LLC; Robert Curcio

(57) ABSTRACT

A method for calibrating a high frequency measurement device having N measurement ports, where N is an integer $\geq 1$, in particular a vector network analyzer, for determining scattering parameters of a measurement object with an n-port measurement, where n is an integer $\geq 1$, wherein a high frequency test signal is fed into a first electrical lead connected to the measurement object or to a circuit having the measurement object, wherein for each port, an HF signal running on a second electrical lead, connected to the measurement object is coupled out from the second electrical lead at a first coupling position and at a second coupling position placed at a distance from the first coupling position, wherein from the two HF signals coupled out, in each port, for each measuring site or coupling site, an amplitude and/or a phase, relative to the HF test signal, of an HF signal running on the second electrical lead to the measurement object and of an HF signal running on the second electrical lead away from the measurement object are determined and therefrom, scattering parameters of the measurement object are calculated.

14 Claims, 3 Drawing Sheets

HF MEASUREMENT SYSTEM, METHOD FOR THE CALIBRATION THEREOF, AND METHOD FOR DETERMINING SCATTERING PARAMETERS WITH THIS HF MEASUREMENT SYSTEM

This application is a National Phase filing of PCT/EP2007/005393, filed on Jun. 19, 2007, under 35 U.S.C. § 371, and claims priority to German Application No. DE 10 2006 030 630.9, filed on Jul. 3, 2006.

BACKGROUND OF THE INVENTION

1. Field of the Invention

The invention relates to a method for calibrating a high frequency measurement device (HF measurement device) comprising N measurement ports, where N is an integer $\geqq 1$, in particular a vector network analyzer, for determining scattering parameters of a measurement object with an n-port measurement, where n is an integer $\geqq 1$, wherein a high frequency test signal (HF test signal) is fed into a first electrical lead connected to the measurement object or to a circuit comprising the measurement object, wherein for each port, an HF signal running on a second electrical lead, in particular a planar lead, connected to the measurement object is coupled out from the second electrical lead at a first coupling position and at a second coupling position placed at a distance from the first coupling position, wherein from the two HF signals coupled out at the two coupling positions, in each port, for each measuring site or coupling site, an amplitude and/or a phase, relative to the HF test signal, of an HF signal running on the second electrical lead to the measurement object and of an HF signal running on the second electrical lead away from the measurement object are determined and therefrom, scattering parameters of the measurement object are calculated, as per the preamble of claim 1.

The invention also relates to a method for determining scattering parameters of a measurement object with an n-port measurement, where n is an integer $\geqq 1$, by means of an HF measurement device comprising N measurement ports, where N is an integer $\geqq 1$, wherein a high frequency test signal (HF test signal) is fed into a first electrical lead connected to the measurement object or to a circuit comprising the measurement object, wherein for each port, an HF signal running on a second electrical lead, in particular a planar lead, connected to the measurement object is coupled out from the second electrical lead at a first coupling position and at a second coupling position of the second electrical lead placed at a distance from the first coupling position, wherein from the two HF signals coupled out at the two coupling positions, in each port, for each coupling site, an amplitude and/or a phase, relative to the HF test signal, of an HF signal running on the second electrical lead to the measurement object and of an HF signal running on the second electrical lead away from the measurement object are determined and therefrom, scattering parameters of the measurement object are calculated, as per the preamble of claim 12.

Finally, the invention also relates to an HF measurement device for determining scattering parameters of a measurement object, in particular a vector network analyzer comprising N measurement ports, where N is an integer $\geqq 1$, and comprising a source for an HF test signal which source can be connected to a first electrical lead connected to the measurement object, as per the preamble of claim 17.

2. Description of Related Art

From DE 103 08 280 A1, a method of this type for calibrating an HF measurement device, a method of this type for determining scattering parameters, and an HF measurement device of this type are known. In the development of complex planar microwave circuits which are constructed from several subcircuits, it is useful to determine the scattering parameters separately for each subcircuit. In this way, the efficiency of the various subcircuits can be individually analyzed and tested. This can be performed in advantageous manner with contactless measuring methods. By means of contactless measuring probes, part of the complex signal energy in a planar electrical transmission lead is coupled out before and after the object (DUT=Device Under Test) being measured and is transmitted to a receiver. From these coupled out signals, the scattering parameters are then calculated. The system dynamics of measuring arrangements of this type depends very strongly on the distance between two contactless measuring probes. These measuring arrangements are therefore only usable in a narrow frequency band.

SUMMARY OF THE INVENTION

Bearing in mind the problems and deficiencies of the prior art, it is an object of the invention to improve a method and an HF measurement device of the aforementioned type in respect of the measuring accuracy over a broad bandwidth.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
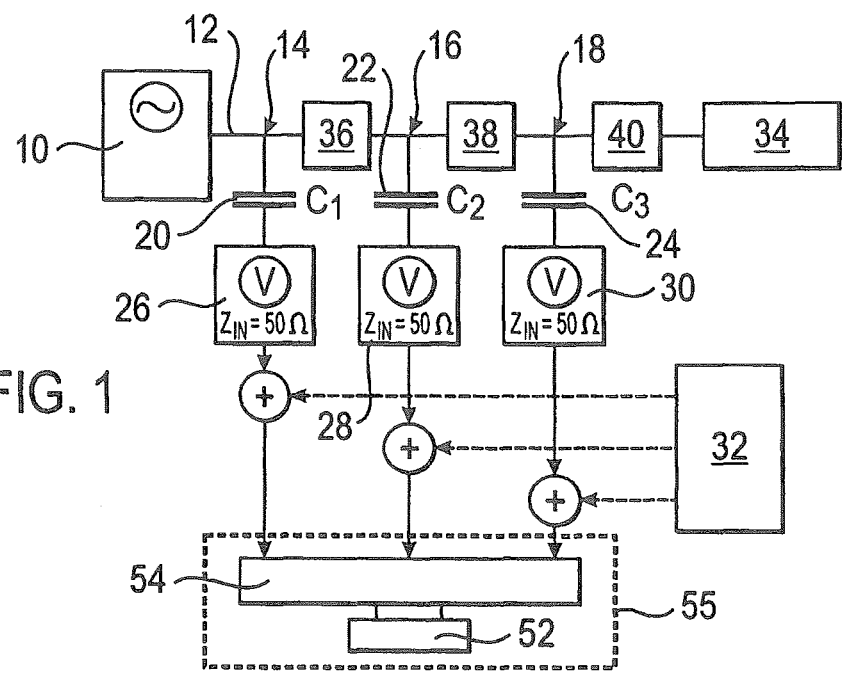
FIG. 1 shows a simulation model for a one-port measurement according to the invention.

In describing the preferred embodiment of the present invention, reference will be made herein to FIGS. 1-5 of the drawings in which like numerals refer to like features of the invention.

The present invention is achieved with a calibration method of the aforementioned type having the characterizing features of claim 1, by means of a method for determining scattering parameters of the aforementioned type with the characterizing features of claim 12, and with an HF measuring device of the aforementioned type with the characterizing features of claim 17. Advantageous embodiments of the invention are described in the other claims.

In a calibration method of the aforementioned type, it is provided according to the invention that for at least one of the ports of the HF measurement device, the HF signal running on the second electrical lead is coupled out of at least three coupling positions placed at a distance from one another, wherein for each pairwise combination of the at least three coupling positions, using a predetermined calibration method with at least one calibration standard as the measurement object, the scattering parameter of which is known, at least one scattering parameter for at least one frequency of the HF test signal is determined, wherein the values determined for all pairwise combinations at one frequency of the HF test signal for the at least one scattering parameter are compared with the known value for the calibration standard for this at least one scattering parameter, wherein that pairwise combination of coupling positions in which the difference between the value of the determined scattering parameter and that known for the calibration standard is at a minimum, is stored as the preferred first and second coupling position for this frequency for measurements on unknown measurement objects.

This has the advantage that it results in improved broadband measurement dynamics, since the first and second coupling positions for measuring the scattering parameters are always chosen from a selection of three or more existing coupling positions such that the deviation of the measured value from the actual value and/or a measuring error is as small as possible.

By way of example, the calibration method used is the SOL method with the calibration standards "short", "open" and "load" or the 8-term or 12-term method or a multi-port calibration method. Alternatively, the calibration method used is the SOLT, the LLR, the TRM, the TAN, the TLN or the LNN method.

In order to minimize the influence of the measurement on the electrical properties of the measurement object, the coupling out of the HF signal at the coupling sites is preferably carried out contactlessly, for example, capacitively or inductively or simultaneously capacitively and inductively or by means of an electro-optical measuring method, by means of a force microscope or by means of an electromagnetic measuring method. According to the invention, any contactless and/or contact-dependent method which determines the electromagnetic waves in terms of value and phase is suitable.

A further additional coupling site is easily obtained, for example, in that the HF signals coupled out of the second electrical lead from at least two coupling sites are brought together to one HF signal by means of at least one mathematical calculation operation and/or at least one algorithm, particularly added or subtracted, and are only then passed on to the measurement port for further signal processing.

In one exemplary embodiment, a measuring probe, which is sequentially positioned at the coupling positions, is used.

In an alternative embodiment, for each measurement port, two or more measuring probes, and particularly a number corresponding to the coupling positions, are used.

For later fault analysis during measurement of an unknown object, a mathematical relationship between the measuring probes is determined and stored during calibration.

In a measuring method of the aforementioned type, it is provided according to the invention that for each frequency of the HF test signal, the pairwise combination of coupling positions stored for this frequency in the calibration method described above is selected as the first and second coupling position.

This has the advantage that the measuring accuracy for a large bandwidth is increased.

A further improvement in the accuracy of the measurement results is achieved in that for each frequency of the HF test signal, in addition to determining the scattering parameters using the stored pairwise combination of coupling positions, determination of the scattering parameters is carried out with one or more pairwise combinations of coupling positions which, during the calibration according to at least one of the claims 1 to 11, has or have produced the next larger difference between the value of the scattering parameter determined and the known scattering parameter for the calibration standard than the stored pairwise combination of coupling positions; herein from all the values for a particular scattering parameter determined at one frequency of the HF test signal, a mean value is calculated for the respective scattering parameter. This lessens the influence of one measuring error due, for example, to a wrongly placed coupling position compared with the position during calibration.

In order to detect a faulty measuring probe, during measurement of an unknown measurement object, the mathematical relationship between a plurality of measuring probes determined during calibration is determined anew and is compared with the values obtained during the calibration, so that if a difference is detected, a defective measuring probe is thereby identified.

It is provided according to the invention in an HF measurement device of the aforementioned type that, for at least one of the measurement ports, at least three coupling positions placed at a distance from one another are provided for coupling out an HF signal running on a second electrical lead, in particular a planar lead, connected to the measurement object.

This has the advantage that, for each measurement, a particular pair of coupling positions that has a low measuring error can be selected.

In a preferred embodiment, for each coupling position, a separate measurement probe placed at the respective coupling position is provided.

In an alternative embodiment, for each measurement port, a single measuring probe and a device for moving this measuring probe to the coupling positions is provided.

In a further alternative embodiment, for each measurement port, a number of measuring probes which is greater than or equal to two and smaller than or equal to the number of coupling positions minus one is provided, wherein the HF measurement device has at least one device for moving at least one of the measuring probes to different coupling positions.

For example, at least one measuring probe is configured as a contactless or contact-dependent measuring probe.

In a preferred embodiment, at least one of the measuring probes is configured for coupling out capacitively or inductively or simultaneously capacitively and inductively or by means of an electro-optical measuring method, by means of force microscopy or by means of an electromagnetic measuring method.

The simulation model of a one-port measurement according to the invention shown in FIG. 1 comprises a signal source 10, which feeds an HF test signal at a power level of 1 dBm into an electrical lead 12 configured as a loss-free 50Ω lead. The contactless coupling, in this example capacitive, at three coupling positions 14, 16, 18 is modeled by three ideal capacitors 20, 22, 24. The capacitive coupling at the coupling positions 14, 16, 18 is purely exemplary. It is also possible to use inductive couplings or mixed capacitive and inductive couplings, or any other type of coupling. The coupled-out voltages are determined at receivers in the form of measuring sites m1 26, m2 28 and m3 30 by means of 50Ω systems. A generator 32 for white Gaussian noise (WGN, White Gaussian Noise) couples in after the measuring sites m1 26, m2 28 and m3 30 in known manner, typically at −118 dBm and 50Ω. A measurement object 34, also referred to as a DUT (Device Under Test), is connected to the electrical lead 12. A first section 36 of the electrical lead 12 between the first coupling site 14 and the second coupling site 16 has a length l1, a second section 38 of the electrical lead 12 between the second coupling site 16 and the third coupling site 18 has a length l2, and a third section 40 of the electrical lead 12 between the third coupling site 18 and the measurement object 34 has a length l3. For example, the aforementioned sections 36, 38 of the electrical lead 12 have the length l1=22 mm, so that the distance between the first and second coupling sites 14, 16 has a value of 22 mm, and l2=78 mm, so that the distance between the second and third coupling sites 16, 18 has a value of 78 mm, wherein therefrom, for the distance between the first and third coupling sites 14, 18, a length of the electrical lead 12 of l1+l2=100 mm results. A conventional calibration system is arranged at 52, for example, an SOL calibration system. A further calibration system of the HF measurement device is arranged at 54; this will now be described:

Firstly, a conventional SOL calibration is carried out with a 50Ω "load", a "short" and an "open" standard for each of the three possible combinations of two of the coupling sites 14, 16, 18. This is purely exemplary. Another calibration method could also be used. Finally, for each combination of the coupling sites 14, 16, 18 for the 50Ω load calibration standard, the value for the scattering parameter S11 is determined. This is purely exemplary. Another scattering parameter and another calibration standard can also be used. The only essential thing is that, for the calibration standard used as the DUT, the value to be expected for the measured scattering parameter is known. In the present case, as low a value as possible is expected for IS11I in dB when a "load" is used as the DUT, since ideally, no reflection occurs at the "load".

Figure 2:
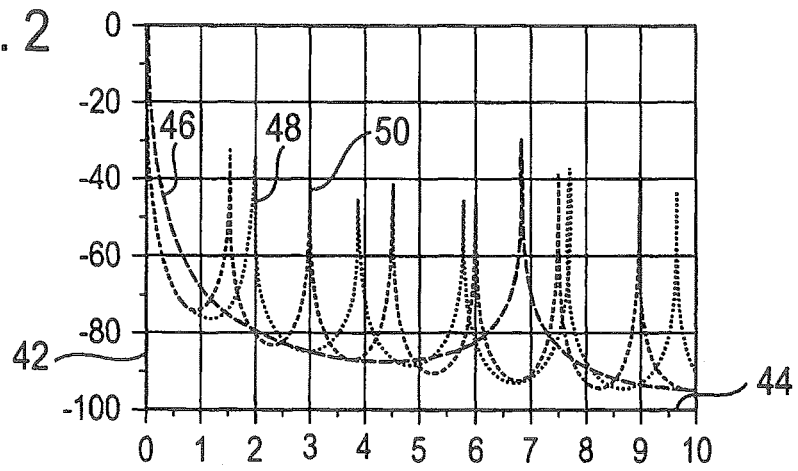
FIG. 2 shows a graphical representation of the system dynamics for different pairings of the coupling positions.

In FIG. 2, using identical capacitive measuring probes at the coupling sites 14, 16, 18 and with a 50Ω "load" calibration standard as the DUT, the simulated scattering parameter IS11I in dB (equivalent to a measured scattering parameter) is shown on the vertical axis 42 and the frequency in GHz is shown on the horizontal axis 44. This representation therefore corresponds to the simulated system dynamics. A first graph 46 shows the values of IS11I in dB over frequency on use of the first and second coupling sites 14, 16, that is for the measuring sites m1 26 and m2 28; a second graph 48 shows the values for IS11I in dB over frequency on use of the second and third coupling sites 16, 18, that is for the measuring sites m2 28 and m3 30, and a third graph 50 shows the values for IS11I in dB over frequency on use of the first and third coupling site 14, 18, that is for the measuring sites m1 26 and m3 30. The distances l1 and l2 between the coupling sites 14, 16 and 18 are chosen so that the maxima of the graphs 46, 48 and 50 do not overlap one another. In order to calibrate the system, for each frequency point, that pairwise combination of two coupling sites 14, 16, 18 is determined for which the scattering parameter IS11I in dB has the smallest separation or the smallest difference from the expected value for IS11I in dB, i.e. in the present example, has the smallest value. This coupling position pair is stored as the preferred coupling position pair for the relevant frequency point and is used for a later measurement of an unknown measurement object or DUT at the respective frequency. This method is designated "diversity calibration" in the following. Thus, the SOL calibration is stored at 52 and the diversity calibration is stored at 54. The DSOL calibration, that is, the diversity SOL calibration is identified overall with the reference sign 55.

Figure 3:
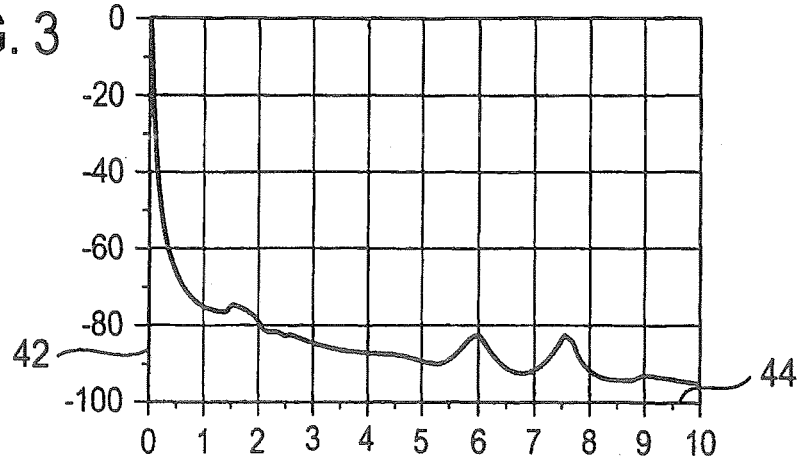
FIG. 3 shows a graphical representation of the system dynamics following a calibration, according to the invention, of the system.

The (simulated) system dynamics resulting from this diversity calibration is shown in FIG. 3. The vertical axis 42 shows the scattering parameter IS11I in dB and the horizontal axis shows the frequency in GHz. It is immediately apparent that the system dynamics have drastically improved at critical frequencies, due to the diversity calibration. Through the efficient selection of distances between the coupling sites 14, 16 and 18 an improvement of 70 dB can be achieved at 6.8 GHz. Furthermore, the diversity calibration results in the measuring arrangement being usable over an extended frequency range.

Figure 4:
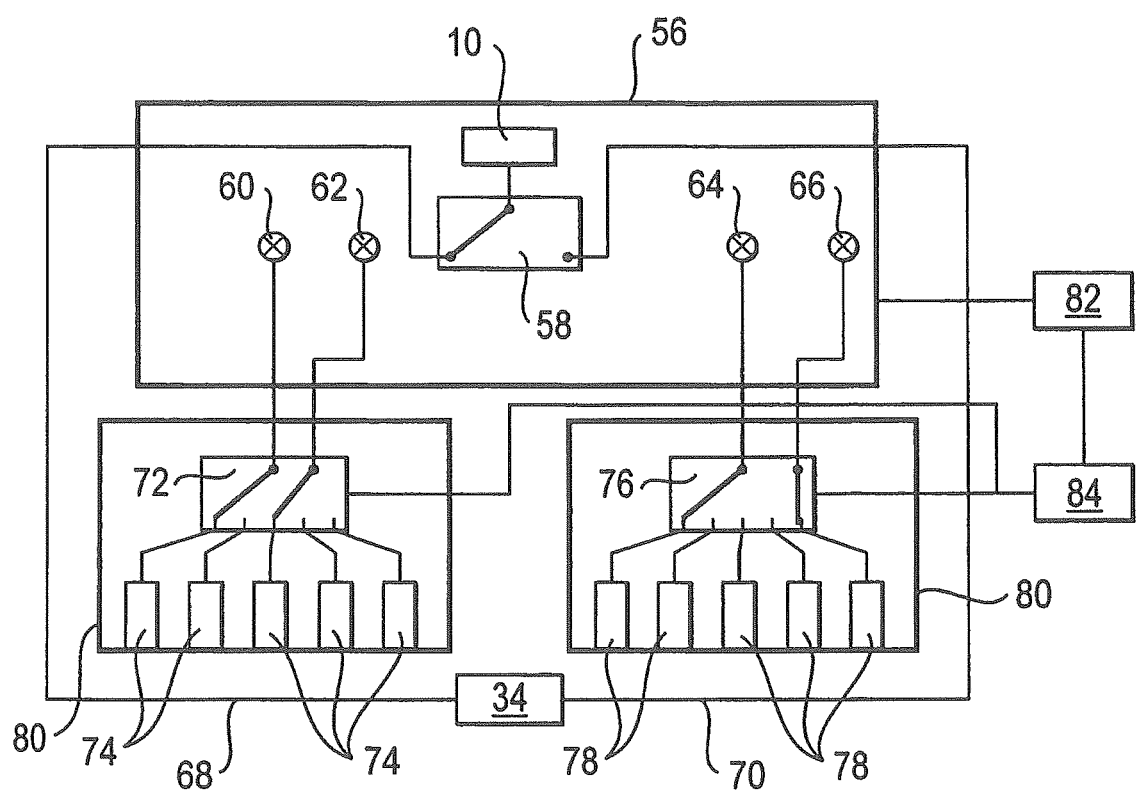
FIG. 4 shows a schematic circuit diagram of a first preferred embodiment of an HF measurement device according to the invention having a 2-port vector network analyser.

An exemplary first preferred embodiment of an HF measurement device according to the invention based on a 2-port vector network analyzer 56 is shown in FIG. 4. The 2-port vector network analyzer 56 comprises the signal source 10 for an HF test signal, a first switch 58 and four measuring sites m1 60, m2 62, m3 64 and m4 66, two for each measurement port. The first switch 58 optionally connects the signal source 10 to electrical leads in the form of front and rear planar leads 68, 70, which enter the DUT 34 from different sides, so that the test signal can be coupled in before and after the DUT 34. The conventional connection of the measuring sites m1 60, m2 62, m3 64 and m4 66 to internal coupling structures of the 2-port vector network analyzer 56 for coupling out the incoming and returning wave on the electrical lead 12 within the 2-port vector network analyzer 56 is separate. Rather than this, the first and second measuring site m1 60, m2 62 are optionally connected via a second switch 72 to the five measuring probes 74 allocated to the first port of the 2-port vector network analyzer 56 such that one of the measuring probes 74 is always connected to the first measuring site m1 60 and another of the measuring probes 74 is always connected to the second measuring site m2 62. Similarly, a third switch 76 is provided which optionally connects another five measuring probes 78 which are allocated to the second port of the 2-port vector network analyzer 56 to the third and fourth measuring site m3 64, m4 66 such that, in each case, one of the measuring probes 78 is always connected to the third measuring site m3 64 and one of the other measuring probes 78 is always connected to the fourth measuring site m4 66. The switches 72, 76 and the measuring probes 74, 78 are each arranged on a substrate 80. The measuring probes 74 allocated to the first port of the 2-port vector network analyzer 56 are placed close to the front planar lead 68, in order to couple out an HF signal from the front planar lead 68 at various coupling sites, whist the measuring probes 78 allocated to the second port of the 2-port vector network analyzer 56 are placed close to the rear planar lead 70, in order to couple out an HF signal from the rear planar lead 70 at various coupling sites. The switches 72, 76 bring about the selection of pairwise arrangements of the coupling positions at which the measuring probes 74 and 78 are placed. A control device 82, in particular a computer, controls the 2-port vector network analyzer 56 and, via a voltage source 84, the switches 72 and 76.

Figure 5:
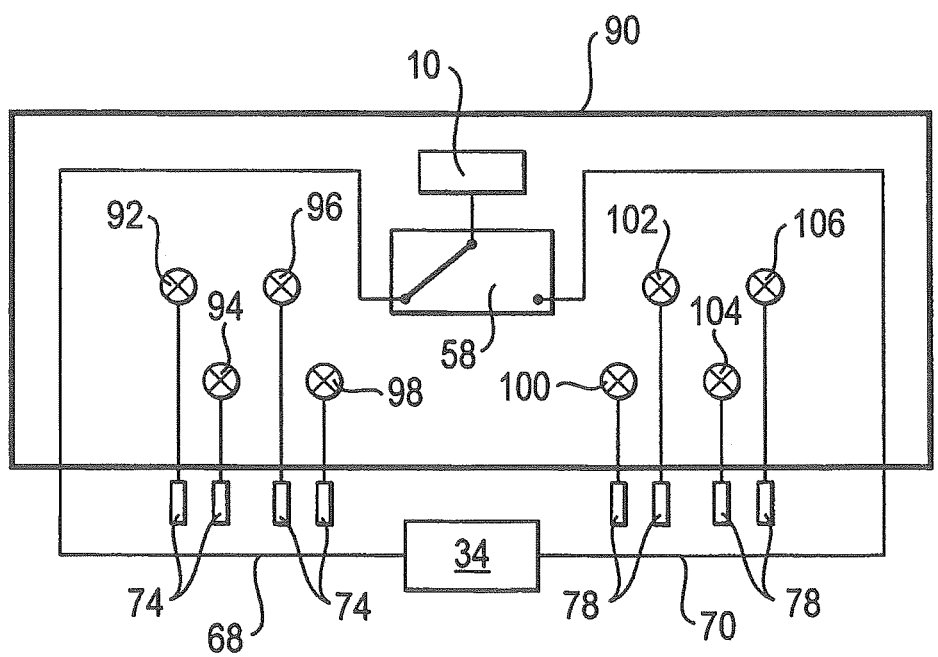
FIG. 5 shows a schematic circuit diagram of a second preferred embodiment of an HF measurement device according to the invention with a 4-port vector network analyser.

An exemplary first preferred embodiment of an HF measurement device according to the invention based on a 4-port vector network analyzer 90 is disclosed in FIG. 5. The 4-port vector network analyzer 90 comprises the signal source 10 for an HF test signal, the first switch 58 and eight measuring sites m1 92, m2 94, m3 96, m4 98, m5 100, m6 102, m7 104 and m8 106, two for each measurement port. The first four measuring sites m1 92, m2 94, m3 96 and m4 98 are each connected to one of the measuring probes 74 which are placed at coupling positions on the front planar lead 68. The second four measuring sites m5 100, m6 102, m7 104 and m8 106 are each connected to one of the measuring probes 78 which are placed at coupling positions on the rear planar lead 70. By using the eight measuring sites m1 92, m2 94, m3 96, m4 98, m5 100, m6 102, m7 104 and m8 106, the second and third switch of the first embodiment as per FIG. 4 can be dispensed with. Selection of two coupling sites in each case, or of two measuring probes 74 and 78 in each case, is made internally in the 4-port vector network analyzer 90, that is, it is a diversity calibration system that is implemented in the network analyzer.

An improvement of the contactless network analyzer method involves the use of more than two measuring probes per measurement port. The redundancy gained through the additional measuring probes is used to improve the measurement dynamics, and by this means, a broadband measurement system can be produced. For this purpose, for the diversity calibration, a conventional calibration is carried out for every possible measuring probe combination. Following the calibration, a reverse measurement is made using the calibrated reference impedance, for example, the load standard or calibration lead, for each probe pair combination. From the calibrated measurement results, conclusions can be drawn about the measurement dynamics. Within one program, for each frequency point, the dynamic ranges of each measuring probe combination are now compared. In each case, the probe pair that has the greatest measurement dynamics is selected. The selection of the probe pairs for each frequency point is stored in the memory and is used for every measurement of unknown measurement objects.

In a contactless diversity measuring system, other optimization criteria can additionally be chosen, for example, the redundancy of the additional probe pair combinations is used to increase the measuring accuracy. For example, in frequency ranges in which a plurality of measuring probe pairs have similar dynamics, the measurement results from the probes for one measurement are averaged. This lessens the influence of a measuring error due, for example, to a wrongly positioned measuring probe.

Furthermore, the redundancy can be used to identify defective or wrongly positioned measuring probes. Once a defective probe has been identified, it can be taken out of the measurement electronically or the faulty behavior can be pointed out to the user. In order to detect a defective measuring probe, for example, a mathematical relationship between the measuring probes is determined during the calibration. The mathematical relationship is then checked for correctness during each measurement of an unknown measurement object.

The design forms of the measuring probes are arbitrary. The probes can be configured as planar or three-dimensional, and they do not have to be identical. Measuring probes with different coupling types can be combined. In the interests of a compact construction, a planar form implemented on a substrate suggests itself.

A coupling site can be configured as a combination of a plurality of probes (e.g. summing of two probe measuring sites). For each frequency point, the probe pair that is most suitable for making the measurement, for example, in respect of the dynamic behavior, measuring accuracy, etc., is selected. The selection takes place during the reverse measurement using a known standard, for example, a load.

The present invention presents a method for calibrating a high frequency measurement device (HF measurement device) having N measurement ports, where N is an integer $\geq 1$, in particular a vector network analyzer, for determining scattering parameters of a measurement object with an n-port measurement, where n is an integer $\geq 1$, wherein a high frequency test signal is fed into a first electrical lead connected to the measurement object or to a circuit having the measurement object, wherein for each port, an HF signal running on a second electrical lead, connected to the measurement object is coupled out from the second electrical lead at a first coupling position and at a second coupling position placed at a distance from the first coupling position, wherein from the two HF signals coupled out at the two coupling positions, in each port, for each measuring site or coupling site, an amplitude and/or a phase, relative to the HF test signal, of an HF signal running on the second electrical lead to the measurement object and of an HF signal running on the second electrical lead away from the measurement object are determined and therefrom, scattering parameters of the measurement object are calculated.

Herein for at least one of the ports of the HF measurement device, the HF signal running on the second electrical lead is coupled out of at least three coupling positions placed at a distance from one another, wherein for each pairwise combination of the at least three coupling positions, using a predetermined calibration method with at least one calibration standard as the measurement object, the scattering parameter of which is known, at least one scattering parameter for at least one frequency of the HF test signal is determined, wherein the values determined for all pairwise combinations at one frequency of the HF test signal for the at least one scattering parameter are compared with the known value for the calibration standard for this at least one scattering parameter, wherein that pairwise combination of coupling positions in which the difference between the value of the determined scattering parameter and that known for the calibration standard is at a minimum, is stored as the preferred first and second coupling position for this frequency for measurements on unknown measurement objects.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for calibrating a high frequency measurement device having N measurement ports, where N is an integer greater than or equal to 1, for determining scattering parameters of a measurement object with an n-port measurement, where n is an integer greater than or equal to 1, comprising:

feeding a high frequency test signal into the measurement object or to a circuit comprising the measurement object;

coupling a high frequency signal in electrical communication with the measurement object, for each measurement port, for each of at least three coupling positions, placed at a distance from one another;

determining for each measurement port an amplitude, phase, or both from the high frequency signals transmitted by the at least three coupling positions, traversing to and away from the measurement object, for each coupling position, said amplitude, phase, or both from the high frequency signals determined relative to the high frequency test signal;

calculating scattering parameters of the measurement object, including for at least one of the measurement ports of the high frequency measurement device, the high frequency signals transmitted by said coupling positions, including at least three coupling positions, the third coupling position placed at a distance from first and second coupling positions;

determining values for at least one scattering parameter for at least one frequency of the high frequency test signal for each pairwise combination of the at least three coupling positions, using a predetermined calibration method with at least one calibration standard as the measurement object having a known scattering parameter; and comparing the values determined with the known scattering parameter value for the calibration standard;

determining a pairwise combination of coupling positions having the least difference between the values of the determined scattering parameter and that known for the calibration standard; and storing said pairwise combination of coupling positions having the least difference as preferred first and second coupling positions for this frequency for measurements on unknown measurement objects.

2. The method of claim 1, wherein the high frequency measurement device includes a vector network analyzer.

3. The method of claim 1 wherein said coupling includes coupling from a planar lead.

4. The method of claim 1 including the calibration method comprising the Short-Open-Load (SOL) method with the calibration standards "short", "open" and "load" or the 8-term or 12-term method.

5. The method of claim 1 including the calibration method comprising the SOLT, the LLR, the TRM, the TAN, the TLN or the LNN method.

6. The method of claim 1 including having the high frequency signal at the coupling sites transmitted contactlessly.

7. The method of claim 1 including having the high frequency signals at the coupling sites transmitted capacitively or inductively or simultaneously capacitively and inductively or by means of an electro-optical measuring method, by means of a force microscope, or by means of an electromagnetic measuring method.

8. The method of claim 1 including having the coupling of the high frequency signal in electrical communication with the measurement object, for each measurement port, for said at least three coupling positions, combined analytically into one high frequency signal by utilizing at least one mathematical calculation operation or at least one algorithm, particularly added or subtracted, the analytically combined high frequency signal then passed on to the measurement port for further signal processing.

9. The method of claim 1 including a measuring probe sequentially positioned at the coupling positions.

10. The method of claim 1 including for each measurement port, two or more measuring probes, or a number of measuring probes corresponding to the coupling positions used.

11. The method of claim 1 including having a mathematical relationship between the measuring probes determined and stored during calibration.

12. A method for determining scattering parameters of a measurement object with an n-port measurement, where n is an integer greater than or equal to 1, by means of a high frequency measurement device having N measurement ports, where N is an integer greater than or equal to 1 comprising:

calibrating said high frequency measurement device according to claim 3;

feeding a high frequency test signal into the measurement object or to a circuit comprising the measurement object, such that for each port, a high frequency signal running on the planar lead, connected to the measurement object is coupled out at a first coupling position and at a second coupling position placed at a distance from the first coupling position;

determining for each measurement port an amplitude, or a phase, or both relative to the high frequency test signal of an high frequency signal running to the measurement object and of a high frequency signal running away from the measurement object, from the two high frequency signals coupled out at the two coupling positions, for each coupling site; and calculating scattering parameters of the measurement object including for each frequency of the high frequency test signal, the pairwise combination of coupling positions stored for this frequency in the calibration method according to claim 3 is selected as the first and second coupling position.

13. The method of claim 12 wherein for each frequency of the high frequency test signal, in addition to determining the scattering parameters using the stored pairwise combination of coupling positions, determination of the scattering parameters is carried out with one or more pairwise combinations of coupling positions which, during calibration, has or have produced using pairwise combinations of coupling positions differences between the value of the scattering parameter determined and the known scattering parameter for the calibration standard, and selecting a minimum difference between the compared values of the determined scattering parameter and the known value for the calibration standard that is greater than the known value, wherein from all the values for a particular scattering parameter determined at one frequency of the high frequency test signal, a mean value is calculated for the respective scattering parameter.

14. The method of claim 12 including having, during measurement of an unknown measurement object, the mathematical relationship between a plurality of measuring probes determined anew and compared with the values obtained during the calibration, so that if a difference is detected, a defective measuring probe is thereby identified.

* * * * *